(12) United States Patent
Yang

(10) Patent No.: US 10,818,619 B1
(45) Date of Patent: Oct. 27, 2020

(54) CHIP PACKAGES AND METHODS FOR FORMING THE SAME

(71) Applicant: SHUNSIN TECHNOLOGY (ZHONG SHAN) LIMITED, Zhongshan (CN)

(72) Inventor: Wang-Lai Yang, Shenzhen (CN)

(73) Assignee: SHUNSIN TECHNOLOGY (ZHONG SHAN) LIMITED, Zhongshan (CN)

( * ) Notice: Subject to any disclaimer, the term of this patent is extended or adjusted under 35 U.S.C. 154(b) by 0 days.

(21) Appl. No.: 16/919,447

(22) Filed: Jul. 2, 2020

Related U.S. Application Data

(62) Division of application No. 15/916,286, filed on Mar. 9, 2018.

(30) Foreign Application Priority Data

Dec. 4, 2017 (CN) .......................... 2017 1 1261230

(51) Int. Cl.
*H01L 27/00* (2006.01)
*B81B 7/00* (2006.01)
*H01L 23/00* (2006.01)
*B81C 1/00* (2006.01)
*H01L 27/146* (2006.01)

(52) U.S. Cl.
CPC .............. *H01L 24/04* (2013.01); *B81B 7/007* (2013.01); *B81C 1/00301* (2013.01); *B81C 1/00317* (2013.01); *H01L 27/14618* (2013.01); *B81B 2201/045* (2013.01); *B81C 2203/0154* (2013.01); *H01L 24/32* (2013.01); *H01L 24/48* (2013.01); *H01L 24/73* (2013.01); *H01L 24/92* (2013.01); *H01L 2224/04042* (2013.01); *H01L 2224/04105* (2013.01); *H01L 2224/12105* (2013.01); *H01L 2224/32225* (2013.01); *H01L 2224/48221* (2013.01); *H01L 2224/48227* (2013.01); *H01L 2224/48235* (2013.01); *H01L 2224/73265* (2013.01); *H01L 2224/92247* (2013.01); *H01L 2924/141* (2013.01); *H01L 2924/143* (2013.01); *H01L 2924/15313* (2013.01); *H01L 2924/181* (2013.01); *H01L 2924/351* (2013.01)

(58) Field of Classification Search
None
See application file for complete search history.

(56) References Cited

U.S. PATENT DOCUMENTS

| | | | | |
|---|---|---|---|---|
| 2009/0027608 A1* | 1/2009 | Nakamura | ............... | G03F 7/033 349/155 |
| 2009/0262226 A1* | 10/2009 | Lee | ................... | H01L 27/14625 348/294 |
| 2013/0207130 A1* | 8/2013 | Reiherzer | ........... | H01L 25/0753 257/88 |

(Continued)

*Primary Examiner* — Mounir S Amer
(74) *Attorney, Agent, or Firm* — ScienBiziP, P.C.

(57) ABSTRACT

A chip package for optical sensing includes a substrate, and a semiconductor device positioned on the substrate and coupled to the substrate through a first conducting element. Two molding processes are applied, to form a first colloid body on the substrate so as to cover the semiconductor device and, on the first colloid body, to form a second colloid body which covers an optical device. The optical device is electrically connected to the substrate through a second conducting element. The light transmittance of the second colloid body exceeds that of the first colloid body.

9 Claims, 5 Drawing Sheets

(56) References Cited

U.S. PATENT DOCUMENTS

| | | | |
|---|---|---|---|
| 2014/0061841 A1* | 3/2014 | Kim | H01L 27/14618 257/443 |
| 2014/0264699 A1* | 9/2014 | Ryu | H01L 27/14618 257/434 |
| 2017/0207352 A1* | 7/2017 | Ho | H01L 31/18 |
| 2019/0057952 A1* | 2/2019 | Chen | H04N 5/2253 |

* cited by examiner

CHIP PACKAGES AND METHODS FOR FORMING THE SAME

CROSS-REFERENCE TO RELATED APPLICATIONS

The application is a divisional of and claims priority from U.S. patent application Ser. No. 15/916,286, filed Mar. 9, 2018, the content of which is hereby incorporated by reference in its entirety.

FIELD

The subject matter herein generally relates to chip packages and manufacturing methods, and more particularly to chip packages and manufacturing methods for combining micro-electromechanical systems (MEMS) and optical sensing chips.

BACKGROUND

With the development of mobile terminals and wearable electronic products, more and more products integrate optical sensing chips with micro-electromechanical systems (MEMS). The thickness of the chip package is increased by stacking optical sensing chips with the MEMS chips. In addition, since the package of the optical sensing chip requires a transparent window that allows light to pass, a transparent colloid body is required to be formed on the optical sensing chip. However, in forming the thick transparent colloid body, the wire bonding is easily bent, and the internal stress is increased.

BRIEF DESCRIPTION OF THE DRAWINGS

Implementations of the present disclosure will now be described with reference to the attached figures.

DETAILED DESCRIPTION

Figure 1:
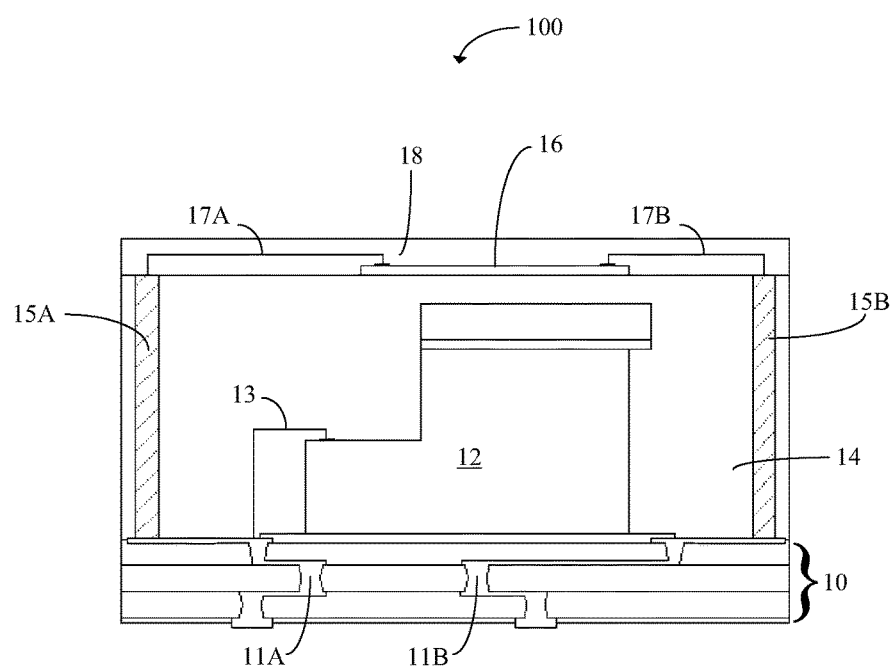
FIG. 1 is a cross-sectional view of the chip package according to an exemplary embodiment of the disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

The embodiments herein provide many applicable inventive concepts that can be embodied in a variety of specific methods. The specific embodiments discussed are merely illustrative of specific methods to make and use the embodiments, and do not limit the scope of the disclosure. In addition, the disclosure may repeat reference numbers and/or letters in the various embodiments. This repetition is for the purpose of simplicity and clarity, and does not imply any relationship between the different embodiments and/or configurations discussed. Furthermore, when a first material layer is referred to as being on or overlying a second material layer, the first material layer may be in direct contact with the second material layer, or spaced apart from the second material layer by intervening layers.

A chip package according to an embodiment of the disclosure may be used to package micro-electromechanical system chips. However, embodiments of the disclosure are not limited thereto. For example, the chip package of the embodiments of the disclosure may be implemented to package active or passive devices or electronic components of integrated circuits, such as digital or analog circuits. For example, the chip package is related to optoelectronic devices, micro-electromechanical systems (MEMS), biometric devices, micro fluidic systems, and physical sensors measuring changes to heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

FIG. 1 is a cross-sectional view of the chip package according to an exemplary embodiment of the disclosure. As shown in FIG. 1, the chip package 100 according to an embodiment of the disclosure comprises a substrate 10, a semiconductor element 12, a colloid body 14, an optical element 16, and a colloid body 18. The substrate 10 may comprise interconnect structures 11A and 11B. The interconnect structures 11A and 11B pass through the substrate 10 for electrically connecting to other elements.

The semiconductor element 12 is positioned on the substrate 10. A terminal of the semiconductor element 12 is electrically connected to the interconnect structure 11A through an electrical connection element 13. In an embodiment, the electrical connection element 13 can be a wire. The semiconductor element 12 can be a chip comprising micro-electromechanical systems, such as an acoustic speaker, a microphone, a radio frequency (RF) filter, an RF antenna, an accelerometer, a gyroscope, a chemical sensor, a temperature sensor, a humidity sensor, a pressure sensor, a light sensor, an infrared sensor, or an actuator.

The colloid body 14 is formed on the substrate 10 and covers the semiconductor element 12. The colloid body 14 provides mechanical stability as well as protection against oxidation, humidity, and other environmental conditions. In one embodiment, the colloid body 14 can be formed from a molded material. The molded material can include, for example, a novolac-based resin, an epoxy-based resin, a silicone-based resin, or another suitable encapsulant. Suitable fillers can also be included, such as powdered $SiO_2$. The molded material may be a pre-impregnated (prepreg) material, such as a pre-impregnated dielectric material.

In an embodiment, the material of the colloid body 14 has coefficients of thermal expansion (CTE) relatively close to that of the semiconductor element 12 to prevent deformation of the semiconductor element 12 due to temperature variations. In the illustrated embodiment, the material of the colloid body 14 is the epoxy-based resin with dark or black color, which has coefficients of thermal expansion relatively close to that of the semiconductor element 12. In addition, there are electrical connection elements 15A and 15B in the colloid body 14. The electrical connection element 15A is electrically connected to the interconnect structure 11A, and the electrical connection element 15B is electrically connected to the interconnect structure 11B. According to an embodiment of the disclosure, the electrical connection elements 15A and 15B can be metal plugs. The electrical connection element 15A passes through a bottom surface of the colloid body 14 adjacent to the substrate 10 and makes contact with the interconnect structures 11A, and passes through a top surface of the colloid body 14 away from the substrate 10. Similarly, the electrical connection element 15B passes through a bottom surface of the colloid body 14 adjacent to the substrate 10 and makes contact with the interconnect structures 11B, and passes through a top surface of the colloid body 14 away from the substrate 10.

The optical element 16 is positioned on the colloid body 14. A terminal of the optical element 16 is electrically connected to the electrical connection element 15A through the electrical connection element 17A. Another terminal of the optical element 16 is electrically connected to the electrical connection element 15B through the electrical connection element 17B. In the illustrated embodiment, the electrical connection elements 17A and 17B can be wires, and the optical element 16 can be a light sensor. In addition, since the electrical connection element 17A is electrically connected to the terminal of the electrical connection element 15A away from the substrate 10, and not to the terminal near the substrate 10, curvature and bending of the wire are decreased, reducing complexity of the wiring layout.

The colloid body 18 is formed on the colloid body 14 and covers the optical element 16. The colloid body 18 also provides mechanical stability as well as protection against oxidation, humidity, and other environmental conditions. In one embodiment, the colloid body 18 can be formed from a molded material. The molded material can include, for example, a novolac-based resin, an epoxy-based resin, a silicone-based resin, or another suitable encapsulant. Suitable fillers can also be included, such as powdered $SiO_2$. The molded material may be a pre-impregnated (prepreg) material, such as a pre-impregnated dielectric material.

According to an embodiment, the colloid body 18 covering the optical element 16 is substantially transparent for light detection. The term "substantially transparent" may be defined as the optical loss of the light being minimal to zero loss. "Substantially transparent" materials may include materials that modify the overall transparent nature of the resin. For example, phosphors or other materials may be added to modify a color of the light, as is known in the art. While the phosphors or other materials may reduce the transparency of the resin, for the purposes of this description, "substantially transparent" is intended to encompass these resins. The transparency of the colloid body 18 exceeds that of the colloid body 14. In other words, the light transmittance of the colloid body 18 exceeds that of the colloid body 14. In an embodiment, the material of the colloid body 18 is a transparent, translucent resin, or a resin light in color. In addition, as shown in FIG. 1, the thickness of the colloid body 18 is less than that of the colloid body 14, therefore a coefficient of thermal expansion of the colloid body 18 can exceed that of the colloid body 14.

FIGS. 2A to 2H show methods for forming a chip package according to exemplary embodiments of the disclosure. In describing certain illustrative examples of the disclosure, the specification may have presented the method and/or process of the disclosure as a particular sequence of steps. However, to the extent that the method or process does not rely on a particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the disclosure should not be limited to the performance of their steps in the order written, and one skilled in the art can readily appreciate that the sequences may be varied and still remain within the spirit and scope of the disclosure.

Figure 2A:
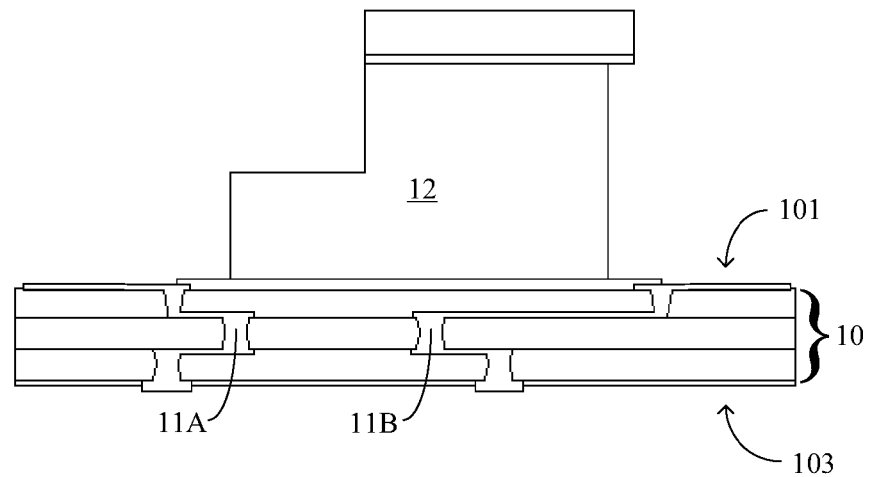
FIGS. 2A to 2H are cross-sectional views of a method for forming a chip package according to an exemplary embodiment of the disclosure.

In FIG. 2A, a substrate 10 is provided. The substrate 10 comprises a surface 101 and a surface 103 opposite to the surface 101. In addition, the substrate 10 comprises interconnection structures 11A and 11B, which pass through the substrate 10 and are exposed from the surfaces 101 and 103. Next, a semiconductor element 12 is positioned on the surface 101 of the substrate 10 by die attached process. In an embodiment, the semiconductor element 12 can be a chip comprising micro-electromechanical systems, such as an acoustic speaker, a microphone, a radio frequency (RF) filter, an RF antenna, an accelerometer, a gyroscope, a chemical sensor, a temperature sensor, a humidity sensor, a pressure sensor, a light sensor, an infrared sensor, or an actuator.

Figure 2B:
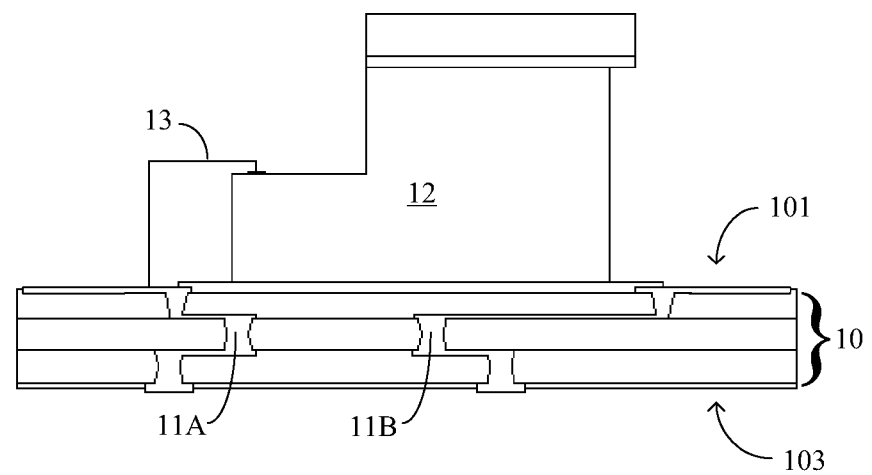

Referring to FIG. 2B, a conductive element 13 is formed to be electrically connected to the interconnection structure 11A and a terminal of the semiconductor element 12 by wire bonding process. In the illustrated embodiment, the conductive element 13 can be a wire.

Figure 2C:
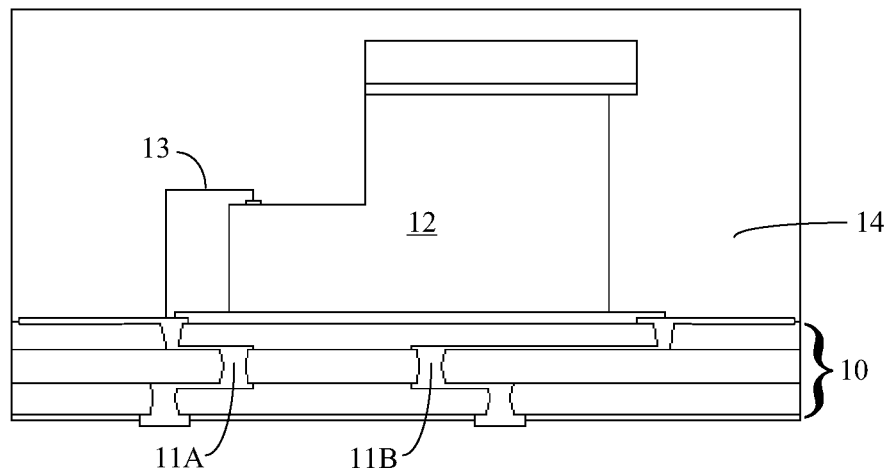

Referring to FIG. 2C, a colloid body 14 is formed on the substrate 10 and the body 14 covers the semiconductor element 12 by a first molding process. In one embodiment, the colloid body 14 can be formed from a molded material. The molded material can include, for example, a novolac-based resin, an epoxy-based resin, a silicone-based resin, or another suitable encapsulant. Suitable fillers can also be included, such as powdered $SiO_2$. The molded material may be a pre-impregnated (prepreg) material, such as a pre-impregnated dielectric material. In an embodiment, the material of the colloid body 14 has coefficients of thermal expansion (CTE) close to that of the semiconductor element 12, to prevent deformations of the semiconductor element 12 in temperature variations. In the illustrated embodiment, the material of the colloid body 14 is the epoxy-based resin with dark or black color.

Figure 2D:
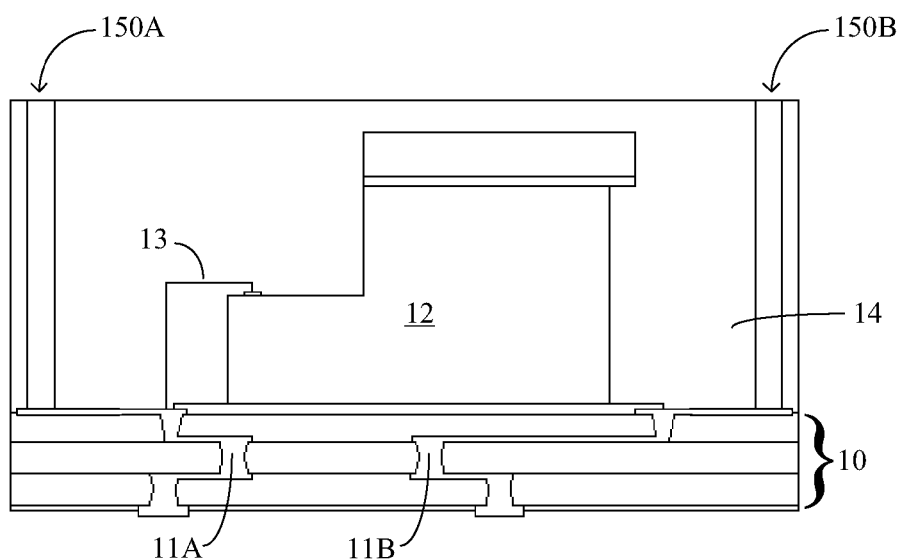

Referring to FIG. 2D, the through holes 150A and 150B are formed in the colloid body 14 by drilling. The through holes 150A and 150B pass through the colloid body 14 and expose the interconnection structures 11A and 11B.

Figure 2E:
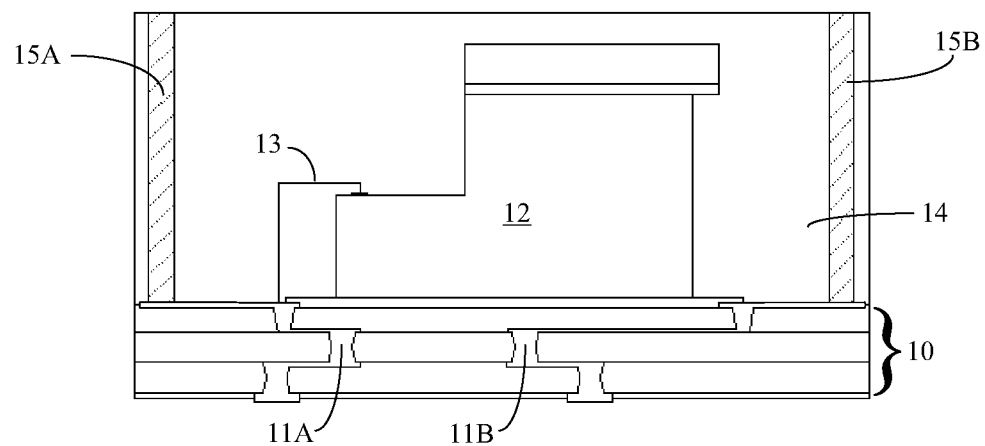

Referring to FIG. 2E, the through holes 150A and 150B are filled by metal material to form electrical connection elements 15A and 15B. The electrical connection elements 15A and 15B can be metal plugs. The electrical connection elements 15A are electrically connected to the interconnect structures 11A, and the electrical connection elements 15B are electrically connected to the interconnect structures 11B. The electrical connection element 15A passes through a bottom surface of the colloid body 14 adjacent to the substrate 10 and makes contact with the interconnect structures 11A, and passes through a top surface of the colloid body 14 away from the substrate 10. Similarly, the electrical connection element 15B passes through a bottom surface of the colloid body 14 adjacent to the substrate 10, makes contact with the interconnect structures 11B, and passes through a top surface of the colloid body 14 away from the substrate 10.

Figure 2F:
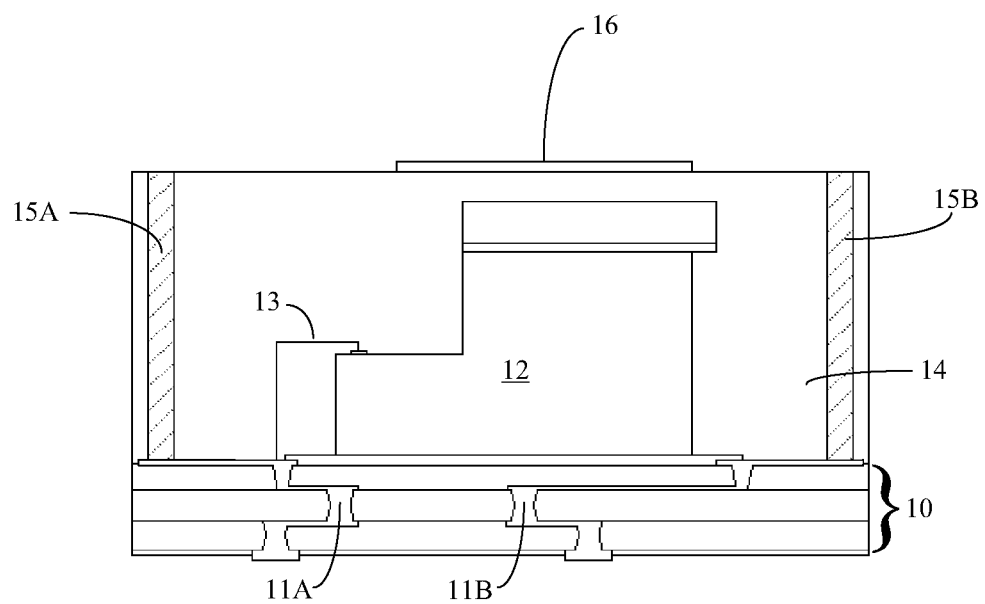

Referring to FIG. 2F, an optical element 16 is positioned on the colloid body 14 by die attached process. In the illustrated embodiment, the optical element 16 can be a light sensor.

Figure 2G:
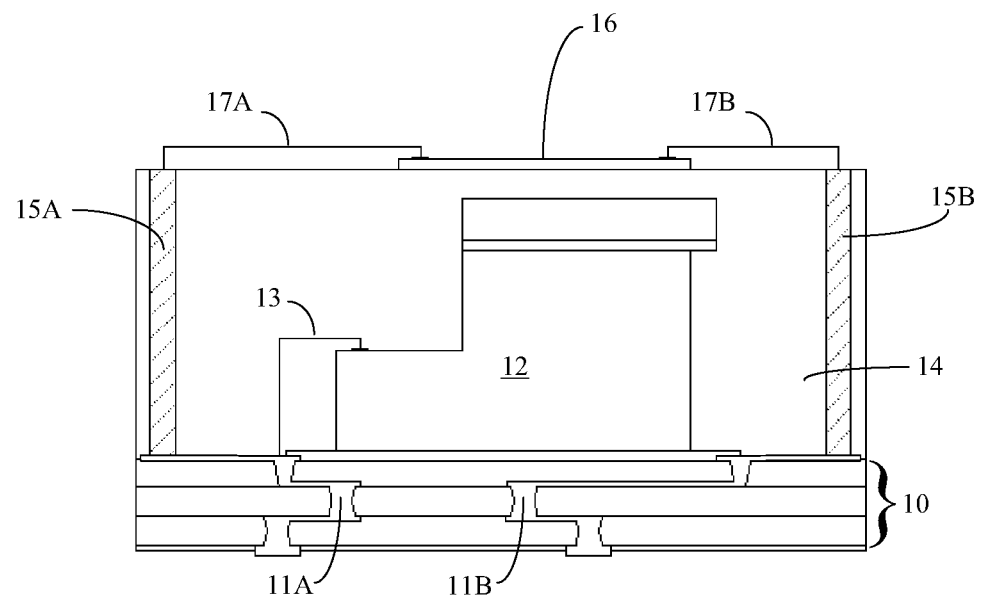

Referring to FIG. 2G a conductive element 17A is electrically connected to the conductive element 15A and a terminal of the optical element 16, and a conductive element 17B is electrically connected to the conductive element 15B and another terminal of the optical element 16 by wire bonding. In the illustrated embodiment, the conductive elements 17A and 17B can be wires.

Figure 2H:
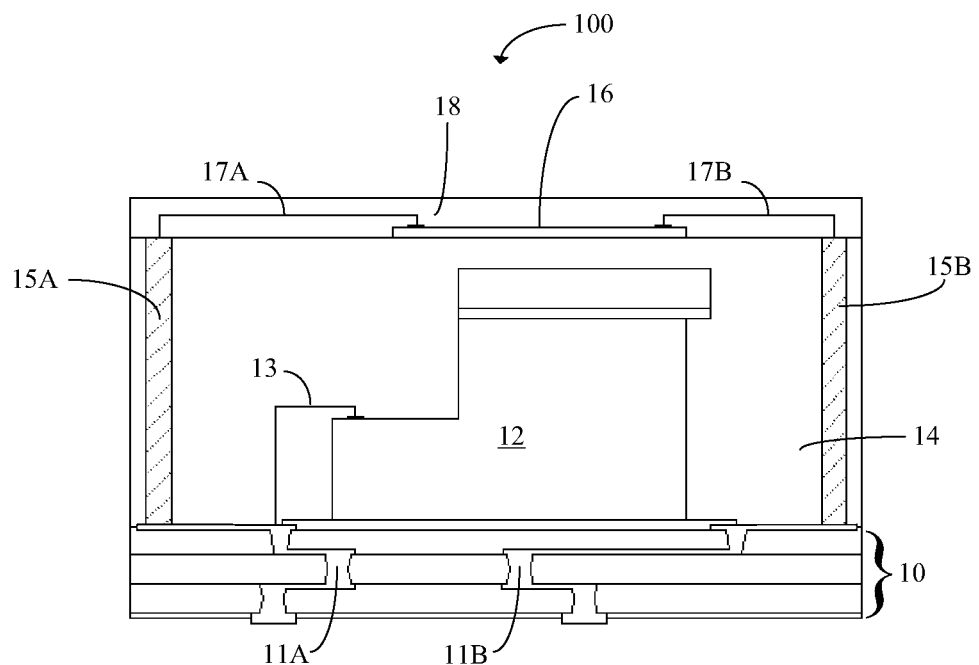

Referring to FIG. 2H, a colloid body 18 is formed on the colloid body 14 and the body 18 covers the optical element 16 by a second molding process. In one embodiment, the colloid body 18 is formed from a molded material. The molded material can include, for example, a novolac-based resin, an epoxy-based resin, a silicone-based resin, or another suitable encapsulant. Suitable fillers can also be included, such as powdered SiO2. The molded material may be a pre-impregnated (prepreg) material, such as a pre-impregnated dielectric material. According to an embodiment, the colloid body 18 covering the optical element 16 is substantially transparent for light detection. Finally, after cutting, the chip package according to an embodiment of the disclosure is obtained.

According to embodiments of the disclosure, the conventional single molding process is replaced by multiple molding processes. Since the colloid body 14 for covering the semiconductor element 12 is thicker, the material of the colloid body 14 which is selected has coefficients of thermal expansion (CTE) that are relatively close to that of the semiconductor element 12. This prevents the semiconductor element 12 being bent in temperature variations, increasing rigidity of the chip package. In the illustrated embodiment, the material of the colloid body 14 is the epoxy-based resin with dark or black color, having coefficients of thermal expansion relatively close to that of the semiconductor element 12. In addition, after the first molding process, the conductive elements 17A and 17B are electrically connected to the conductive elements 15A and 15B and to the optical element 16 on the top surface of the colloid body 14; curvature and bending of the wire is decreased, reducing complexity of the wiring layout. In the second molding process, the colloid body 18 is substantially transparent for light detection. Thus, the chip packages according to embodiments of the disclosure have high rigidity and are able to detect light, improving reliability and functionality of products.

Many details are often found in the art such as the other features of chip packages. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for forming a chip package comprising:
providing a substrate having a first surface and a second surface opposite to the first surface, wherein the substrate comprises an interconnection structure passing through the first surface and the second surface;
positioning a semiconductor element on the first surface;
forming a first conductive element coupled between the interconnection structure and the semiconductor element;
forming a first colloid body on the substrate and covering the semiconductor element;
forming a through hole in the first colloid body to expose the interconnection structure;
filling metal into the through hole to form a metal plug;
positioning an optical element on the first colloid body;
forming a second conductive element coupled between the optical element and the metal plug;
forming a second colloid body on the first colloid body and covering the optical element.

2. The method of claim 1, wherein the semiconductor element comprises micro-electromechanical systems.

3. The method of claim 1, wherein a thickness of the second colloid body is less than that of the first colloid body.

4. The method of claim 1, wherein a coefficient of thermal expansion of the second colloid body exceeds that of the first colloid body.

5. The method of claim 1, wherein a material of the first colloid body is a resin with dark color.

6. The method of claim 1, wherein a material of the second colloid body is a transparent resin.

7. The method of claim 1, wherein the second colloid body is in direct physical contact with both the first colloid body and the optical element.

8. The method of claim 1, further comprising forming a third conductive element in the first colloid body, the third conductive element in direct physical contact with both the first conductive element and the second conductive element.

9. The method of claim 1, wherein a light transmittance of the second colloid body exceeds that of the first colloid body.

* * * * *